United States Patent
Miyanaga et al.

(10) Patent No.: US 10,192,994 B2
(45) Date of Patent: Jan. 29, 2019

(54) OXIDE SEMICONDUCTOR FILM INCLUDING INDIUM, TUNGSTEN AND ZINC AND THIN FILM TRANSISTOR DEVICE

(71) Applicant: Sumitomo Electric Industries, Ltd., Osaka-shi (JP)

(72) Inventors: Miki Miyanaga, Itami (JP); Kenichi Watatani, Itami (JP); Hideaki Awata, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 15/119,258

(22) PCT Filed: Aug. 21, 2015

(86) PCT No.: PCT/JP2015/073478
§ 371 (c)(1),
(2) Date: Aug. 16, 2016

(87) PCT Pub. No.: WO2016/121152
PCT Pub. Date: Aug. 4, 2016

(65) Prior Publication Data
US 2017/0012133 A1    Jan. 12, 2017

(30) Foreign Application Priority Data

Jan. 26, 2015  (JP) ................................ 2015-012150
Feb. 25, 2015  (JP) ................................ 2015-035297

(51) Int. Cl.
*H01L 29/78* (2006.01)
*H01L 21/47* (2006.01)
(Continued)

(52) U.S. Cl.
CPC .......... *H01L 29/7869* (2013.01); *C01G 41/00* (2013.01); *C01G 41/006* (2013.01);
(Continued)

(58) Field of Classification Search
CPC ... H01L 29/7869; H01L 21/477; H01L 29/24; H01L 21/02565; H01L 21/02631;
(Continued)

(56) References Cited

U.S. PATENT DOCUMENTS

2006/0043410 A1*  3/2006  Iwasaki ................ C09K 11/574
                                                    257/103
2007/0026580 A1*  2/2007  Fujii ................... H01L 21/0271
                                                    438/149
(Continued)

FOREIGN PATENT DOCUMENTS

CN      101911303 A     12/2010
JP      2002-256424 A    9/2002
(Continued)

OTHER PUBLICATIONS

Hori et al., "Color Liquid Crystal Display," Kyoritsu Shuppan Co., Ltd., Jun. 2001, pp. 107-109.
(Continued)

*Primary Examiner* — Didarul Mazumder
(74) *Attorney, Agent, or Firm* — Venable LLP; Michael A. Sartori; Kerri M. Patterson

(57) ABSTRACT

There is provided an oxide semiconductor film composed of nanocrystalline oxide or amorphous oxide, wherein the oxide semiconductor film includes indium, tungsten and zinc, a content rate of tungsten to a total of indium, tungsten and zinc in the oxide semiconductor film is higher than 0.5 atomic % and equal to or lower than 5 atomic %, and an
(Continued)

electric resistivity is equal to or higher than $10^{-1}$ Ωcm. There is also provided a semiconductor device including the oxide semiconductor film.

8 Claims, 5 Drawing Sheets

(51) Int. Cl.
| | |
|---|---|
| *H01L 29/24* | (2006.01) |
| *H01L 21/02* | (2006.01) |
| *C01G 41/00* | (2006.01) |
| *H01L 21/46* | (2006.01) |
| *C23C 14/08* | (2006.01) |
| *C23C 14/34* | (2006.01) |
| *H01L 21/16* | (2006.01) |
| *H01L 21/00* | (2006.01) |
| *H01L 29/786* | (2006.01) |
| *H01L 21/467* | (2006.01) |
| *H01L 21/477* | (2006.01) |
| *H01L 29/26* | (2006.01) |

(52) U.S. Cl.
CPC ............ *C23C 14/08* (2013.01); *C23C 14/083* (2013.01); *C23C 14/086* (2013.01); *C23C 14/34* (2013.01); *H01L 21/02554* (2013.01); *H01L 21/02565* (2013.01); *H01L 21/02631* (2013.01); *H01L 21/467* (2013.01); *H01L 21/477* (2013.01); *H01L 29/24* (2013.01); *H01L 29/263* (2013.01); *H01L 29/786* (2013.01); *C01P 2006/40* (2013.01)

(58) Field of Classification Search
CPC ....... H01L 21/467; H01L 21/16; H01L 21/00; H01L 21/479; C23C 14/086; C23C 14/083; C23C 14/34; C01P 2006/40; C01G 41/006
USPC .................. 257/43; 438/85, 86, 104, 754
See application file for complete search history.

(56) References Cited

U.S. PATENT DOCUMENTS

| | | | |
|---|---|---|---|
| 2007/0194379 | A1 | 8/2007 | Hosono et al. |
| 2009/0261337 | A1* | 10/2009 | Sakakura ................ H01L 27/12 257/72 |
| 2010/0025680 | A1 | 2/2010 | Shino et al. |
| 2010/0051936 | A1* | 3/2010 | Hayashi .............. H01L 29/7869 257/43 |
| 2010/0065837 | A1 | 3/2010 | Omura et al. |
| 2010/0276688 | A1 | 11/2010 | Yano et al. |
| 2011/0062436 | A1 | 3/2011 | Yamazaki et al. |
| 2011/0168994 | A1 | 7/2011 | Kawashima et al. |
| 2012/0037897 | A1* | 2/2012 | Shiino ................... C23C 14/086 257/40 |
| 2013/0009111 | A1 | 1/2013 | Morita et al. |
| 2014/0284596 | A1 | 9/2014 | Yamazaki et al. |
| 2015/0279943 | A1 | 10/2015 | Nakayama |

FOREIGN PATENT DOCUMENTS

| | | |
|---|---|---|
| JP | 2008-192721 A | 8/2008 |
| JP | 2011-077511 A | 4/2011 |
| JP | 2012-067387 A | 4/2012 |
| JP | 5172918 B2 | 3/2013 |
| JP | 2014-061493 A | 4/2014 |
| JP | 2014-078645 A | 5/2014 |
| JP | 2014-164142 A | 9/2014 |
| JP | 2014-205608 A | 10/2014 |
| KR | 10-2009-0089450 A | 8/2009 |
| KR | 10-2011-0020901 A | 3/2011 |
| TW | 200943552 A | 10/2009 |
| WO | WO-2005/088726 A1 | 9/2005 |
| WO | WO-2010/119952 A1 | 10/2010 |
| WO | WO-2011/126093 A1 | 10/2011 |
| WO | WO-2014/058019 A1 | 4/2014 |

OTHER PUBLICATIONS

Kawamura et al., "Low-Voltage Operating Amorphous Oxide TFTs," IDW2009 AMD8-1, p. 1689-1692.
International Search Report in International Application No. PCT/JP2015/073478, dated Nov. 2, 2015.

* cited by examiner

FIG.5
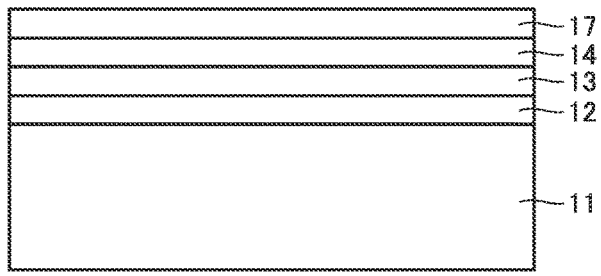
(A)
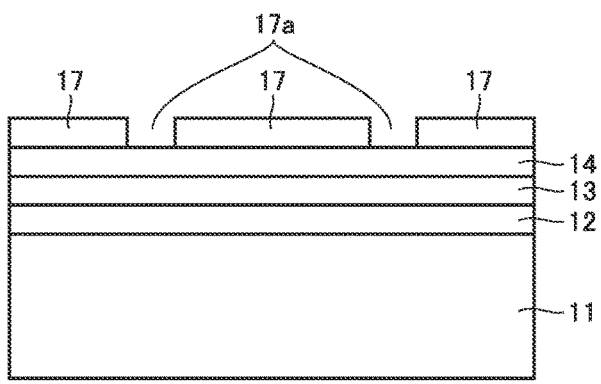
(B)
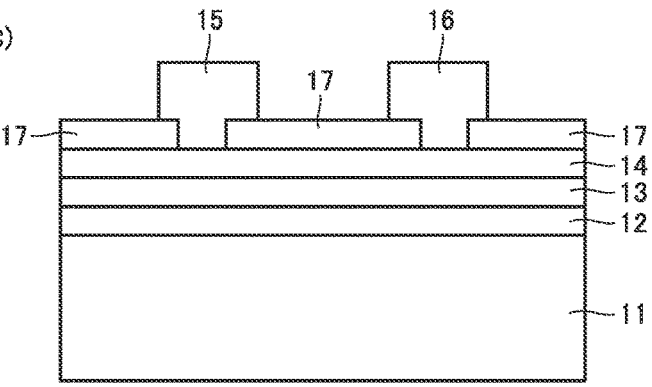
(C)
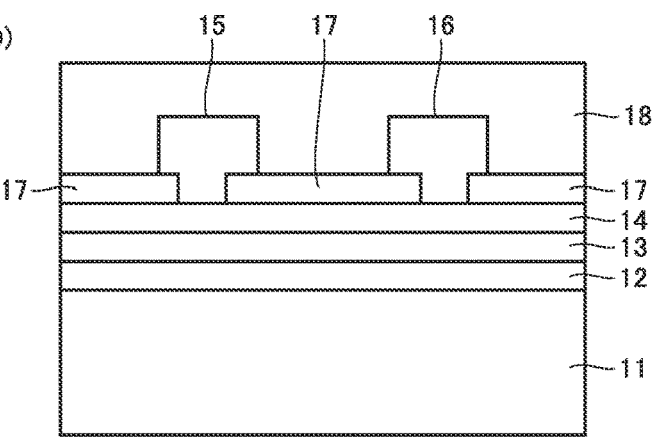
(D)

— 1 —

OXIDE SEMICONDUCTOR FILM INCLUDING INDIUM, TUNGSTEN AND ZINC AND THIN FILM TRANSISTOR DEVICE

TECHNICAL FIELD

The present invention relates to an oxide semiconductor film and a semiconductor device including the same.

BACKGROUND ART

In a liquid crystal display device, a thin-film EL (electroluminescence) display device, an organic EL display device or the like, an amorphous silicon (a-Si) film has been conventionally mainly used as a semiconductor film that functions as a channel layer of a TFT (thin-film transistor) which is a semiconductor device.

In recent years, attention has been focused on a composite oxide including indium (In), gallium (Ga) and zinc (Zn), i.e., an In—Ga—Zn-based composite oxide (also referred to as "IGZO"), as an alternative material to a-Si. A higher carrier mobility can be expected in an IGZO-based oxide semiconductor as compared with a-Si.

International Publication No. 2005/088726 (PTD 1) discloses that a field-effect mobility of approximately 0.5 to 10 $cm^2/Vs$ is obtained when an amorphous oxide having an electron carrier concentration lower than $10^{18}/cm^3$ is used in a channel layer of a TFT.

Japanese Patent Laying-Open No. 2008-192721 (PTD 2) discloses an oxide sintered body mainly made of indium and including tungsten, as a material suitably used when forming an oxide semiconductor film by the sputtering method and the like.

CITATION LIST

Patent Document

PTD 1: International Publication No. 2005/088726
PTD 2: Japanese Patent Laying-Open No. 2008-192721
PTD 3: Japanese Patent No. 5172918

Non Patent Document

NPD 1: Color Liquid Crystal Display (Hiroo Hori, Koji Suzuki, Kyoritsu Shuppan Co., Ltd., Publication Date: June, 2001)
NPD 2: Tetsufumi Kawamura et al., "Low-Voltage Operating Amorphous Oxide TFTs", IDW2009 AMD8-1, P1689-1692

SUMMARY OF INVENTION

Technical Problem

The amorphous oxide described in PTD 1 has a problem in that the field-effect mobility is at most approximately 10 $cm^2/Vs$.

A TFT including, as a channel layer, the oxide semiconductor film fabricated by using the oxide sintered body described in PTD 2 has a problem that a threshold voltage $V_{th}$ is higher than 4 V. According to NPD 1 above, in a-Si which is a semiconductor material for a TFT that has been previously used for a display application, $V_{th}$ is generally 2 to 4 V. From the perspective of simplicity of device design, it is desirable that the display can operate within the same range of $V_{th}$ as 2 to 4 V even when the semiconductor material is switched to an oxide semiconductor.

An object of the present invention is to provide an oxide semiconductor film that can provide a semiconductor device having excellent threshold voltage and field-effect mobility, and a semiconductor device including the oxide semiconductor film.

Solution to Problem

An oxide semiconductor film according to one aspect of the present invention is an oxide semiconductor film composed of nanocrystalline oxide or amorphous oxide, wherein the oxide semiconductor film includes indium, tungsten and zinc, a content rate of tungsten to a total of indium, tungsten and zinc in the oxide semiconductor film is higher than 0.5 atomic % and equal to or lower than 5 atomic %, and an electric resistivity is equal to or higher than $10^{-1}$ Ωcm.

A semiconductor device according to another aspect of the present invention includes the oxide semiconductor film of the aforementioned aspect.

Advantageous Effects of Invention

According to the foregoing, there can be provided an oxide semiconductor film that can provide a semiconductor device having excellent threshold voltage and field-effect mobility, and a semiconductor device including the oxide semiconductor film.

BRIEF DESCRIPTION OF DRAWINGS

FIG. 1 is a schematic view showing one example of a semiconductor device according to one aspect of the present invention, in which FIG. 1(A) shows a schematic plan view and FIG. 1(B) shows a schematic cross-sectional view taken along line IB-IB shown in FIG. 1(A).

FIG. 5 is a schematic cross-sectional view showing one example of a method for manufacturing the semiconductor device shown in FIG. 2.

DESCRIPTION OF EMBODIMENTS

Figure 1:
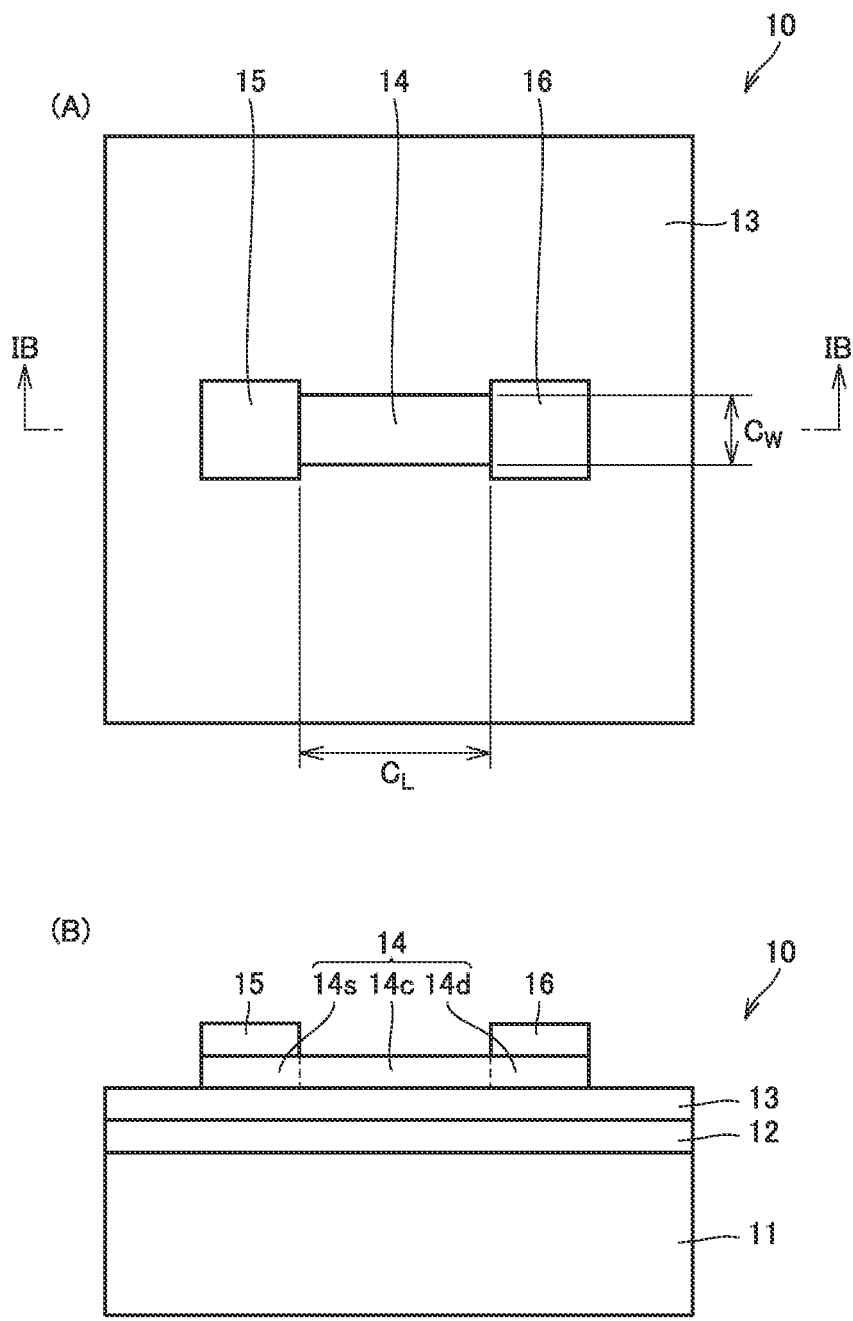

<Description of Embodiments of the Present Invention>
First, embodiments of the present invention will be listed and described.

[1] An oxide semiconductor film according to one embodiment of the present invention is an oxide semiconductor film composed of nanocrystalline oxide or amorphous oxide, wherein the oxide semiconductor film includes indium, tungsten and zinc, a content rate of tungsten to a total of indium, tungsten and zinc in the oxide semiconductor film is higher than 0.5 atomic % and equal to or lower than 5 atomic %, and an electric resistivity is equal to or higher than $10^{-1}$ Ωcm. According to the oxide semiconductor film of the present embodiment, threshold voltage $V_{th}$ of 0 to 4 V (and further 2 to 4 V) can be achieved and a high field-effect mobility can be achieved in a semiconductor device (e.g., a TFT) including this oxide semiconductor film as a channel layer. In addition, according to the oxide semiconductor film of the present embodiment, the OFF current can also be decreased and the aforementioned excellent threshold voltage $V_{th}$ and field-effect mobility can also be achieved in a semiconductor device (e.g., a TFT) including this oxide semiconductor film as a channel layer. Since the OFF current is decreased, a ratio of the ON current to the OFF current can be increased at low driving voltage.

[2] In the oxide semiconductor film according to the present embodiment, a film thickness may be equal to or greater than 2 nm and equal to or smaller than 25 nm. The film thickness within this range is advantageous in increasing the field-effect mobility, decreasing threshold voltage $V_{th}$ and/or decreasing the OFF current.

[3] In the oxide semiconductor film according to the present embodiment, an atomic ratio of zinc to tungsten (Zn/W ratio) in the oxide semiconductor film may be equal to or higher than 0.5 and equal to or lower than 30. The Zn/W ratio within this range is advantageous in increasing the field-effect mobility, decreasing threshold voltage $V_{th}$ and/or decreasing the OFF current.

[4] The oxide semiconductor film according to the present embodiment may be obtained by a manufacturing method including a step of film formation by a sputtering method. This is advantageous in achieving threshold voltage $V_{th}$ of 0 to 4 V (and further 2 to 4 V) and achieving a high field-effect mobility in a semiconductor device (e.g., a TFT) including the oxide semiconductor film as a channel layer. In addition, this is advantageous in decreasing the OFF current and achieving the aforementioned excellent threshold voltage $V_{th}$ and field-effect mobility in a semiconductor device (e.g., a TFT) including the oxide semiconductor film as a channel layer.

[5] The oxide semiconductor film according to the present embodiment may be obtained by performing heating treatment after film formation by the sputtering method, or by performing heating treatment during film formation by the sputtering method. This is advantageous in achieving threshold voltage $V_{th}$ of 0 to 4 V (and further 2 to 4 V) and achieving a high field-effect mobility in a semiconductor device (e.g., a TFT) including the oxide semiconductor film as a channel layer. In addition, this is advantageous in decreasing the OFF current and achieving the aforementioned excellent threshold voltage $V_{th}$ and field-effect mobility in a semiconductor device (e.g., a TFT) including the oxide semiconductor film as a channel layer.

[6] A semiconductor device according to another embodiment of the present invention includes the oxide semiconductor film according to the aforementioned embodiment. Since the semiconductor device of the present embodiment includes the oxide semiconductor film according to the aforementioned embodiment, threshold voltage $V_{th}$ of 0 to 4 V (and further 2 to 4 V) can be achieved and a high field-effect mobility can be achieved. In addition, the OFF current can also be decreased and the aforementioned excellent threshold voltage $V_{th}$ and field-effect mobility can also be achieved in the semiconductor device of the present embodiment. Although the semiconductor device is not particularly limited, a TFT (thin-film transistor) including the oxide semiconductor film according to the aforementioned embodiment as a channel layer is a suitable example.

[7] The semiconductor device according to the present embodiment may further include a layer arranged to be in contact with at least a part of the oxide semiconductor film. In this case, the layer may be at least one of a nanocrystalline layer and an amorphous layer. Further inclusion of the layer is advantageous in achieving threshold voltage $V_{th}$ of 0 to 4 V (and further 2 to 4 V) and achieving a high field-effect mobility in the semiconductor device. In addition, further inclusion of the layer is advantageous in decreasing the OFF current and achieving the aforementioned excellent threshold voltage $V_{th}$ and field-effect mobility in the semiconductor device.

[8] In the semiconductor device according to the present embodiment, the layer arranged to be in contact with at least a part of the oxide semiconductor film may be an oxide layer including at least one of silicon and aluminum. The feature that the layer is an oxide layer including at least one of silicon and aluminum is advantageous in achieving threshold voltage $V_{th}$ of 0 to 4 V (and further 2 to 4 V) and achieving a high field-effect mobility in the semiconductor device. In addition, this feature is advantageous in decreasing the OFF current and achieving the aforementioned excellent threshold voltage $V_{th}$ and field-effect mobility in the semiconductor device.

<Details of Embodiments of the Present Invention>

[First Embodiment: Oxide Semiconductor Film]

The oxide semiconductor film according to the present embodiment is an oxide semiconductor film composed of nanocrystalline oxide or amorphous oxide, wherein the oxide semiconductor film includes indium, tungsten and zinc, a content rate of tungsten to a total of indium, tungsten and zinc in the oxide semiconductor film is higher than 0.5 atomic % and equal to or lower than 5 atomic %, and an electric resistivity is equal to or higher than $10^{-1}$ Ωcm. According to the oxide semiconductor film of the present embodiment, threshold voltage $V_{th}$ of 0 to 4 V (and further 2 to 4 V) can be achieved and a high field-effect mobility can be achieved in a semiconductor device (e.g., a TFT) including this oxide semiconductor film as a channel layer. In addition, according to the oxide semiconductor film of the present embodiment, the OFF current can also be decreased and the aforementioned excellent threshold voltage $V_{th}$ and field-effect mobility can also be achieved in a semiconductor device (e.g., a TFT) including this oxide semiconductor film as a channel layer. Since the OFF current is decreased, a ratio of the ON current to the OFF current can be increased at low driving voltage.

"Nanocrystalline oxide" herein refers to an oxide in which a peak caused by the crystals is not observed and only a broad peak called "halo" appearing on the low angle side is observed by X-ray diffraction measurement in accordance with the following conditions, and in which a ring-like pattern is observed when transmission electron beam diffraction measurement of a minute region is performed by using a transmission electron microscope in accordance with the following conditions. The ring-like pattern includes the case in which spots gather to form the ring-like pattern.

"Amorphous oxide" herein refers to an oxide in which a peak caused by the crystals is not observed and only a broad peak called "halo" appearing on the low angle side is observed by X-ray diffraction measurement in accordance with the following conditions, and in which an obscure pattern called "halo" is again observed when transmission electron beam diffraction measurement of a minute region is performed by using a transmission electron microscope in accordance with the following conditions.

(X-ray Diffraction Measurement Conditions)

Measurement method: In-plane method (slit collimation method)

X-ray generating portion: anticathode Cu, output of 50 kV, 300 mA

Detecting portion: scintillation counter

Incidence portion: slit collimation
Solar slit: incidence side longitudinal divergence angle of 0.48°
light receiving side longitudinal divergence angle of 0.41°
Slit: incidence side S1=1 mm*10 mm
light receiving side S2=0.2 mm* 10 mm
Scanning condition: scanning axis of $2\theta_\chi/\phi$
Scanning mode: step measurement, scanning range of 10 to 80°, step width of 0.1°, step time of 8 sec.

(Transmission Electron Beam Diffraction Measurement Conditions)
Measurement method: microscopic electron beam diffraction method
Accelerating voltage: 200 kV
Beam diameter: same as or equivalent to a film thickness of an oxide semiconductor film to be measured In the case where the oxide semiconductor film according to the present embodiment is composed of nanocrystalline oxide, the ring-like pattern is observed as described above and a spot-like pattern is not observed when transmission electron beam diffraction measurement of a minute region is performed in accordance with the aforementioned conditions. In contrast, an oxide semiconductor film disclosed in PTD 3 described above, for example, includes c-axis oriented crystals along the direction perpendicular to the surface of the film, and when the nanocrystals in a minute region are oriented in a certain direction as described above, the spot-like pattern is observed. In the case where the oxide semiconductor film according to the present embodiment is composed of nanocrystalline oxide, the nanocrystals have a non-orientation property, i.e., the nanocrystals are not oriented with respect to the surface of the film, and have random orientation, when a surface (film cross section) perpendicular to the film surface is at least observed. In other words, the crystal axis is not oriented with respect to the film thickness direction.

Since the oxide semiconductor film according to the present embodiment is composed of nanocrystalline oxide or amorphous oxide, a high field-effect mobility of, for example, 30 cm²/Vs or higher can be achieved in a semiconductor device including this oxide semiconductor film as a channel layer. In order to increase the mobility, the oxide semiconductor film according to the present embodiment is more desirably composed of amorphous oxide.

The oxide semiconductor film according to the present embodiment includes indium (In), tungsten (W) and zinc (Zn), and the content rate of W to the total of In, W and Zn included in the oxide semiconductor film (hereinafter also referred to as "W content rate") is higher than 0.5 atomic % and equal to or lower than 5 atomic %. Since the W content rate is higher than 0.5 atomic %, threshold voltage $V_{th}$ of 0 to 4 V (and further 2 to 4 V) can be achieved in a semiconductor device (e.g., a TFT) including the oxide semiconductor film as a channel layer. If the W content rate is equal to or lower than 0.5 atomic %, the carrier concentration becomes too high and threshold voltage $V_{th}$ becomes large on the negative side. In addition, in a semiconductor device including the oxide semiconductor film as a channel layer, the field-effect mobility decreases at the time of heating treatment. From the perspective of suppressing threshold voltage $V_{th}$ and the decrease in field-effect mobility at the time of heating, the W content rate is preferably equal to or higher than 0.55 atomic %, more preferably equal to or higher than 0.6 atomic %, and further preferably equal to or higher than 0.7 atomic %. A higher W content rate is desirable for achieving the amorphous oxide.

On the other hand, since the W content rate is equal to or lower than 5 atomic %, a high field-effect mobility can be achieved in a semiconductor device (e.g., a TFT) including the oxide semiconductor film as a channel layer. If the W content rate exceeds 5 atomic %, a sufficiently high field-effect mobility is not obtained. From the perspective of the field-effect mobility, the W content rate is preferably equal to or lower than 4 atomic %, more preferably equal to or lower than 3 atomic %, further preferably equal to or lower than 2 atomic %, and particularly preferably equal to or lower than 1.5 atomic %.

The electric resistivity of the oxide semiconductor film according to the present embodiment is equal to or higher than $10^{-1}$ Ωcm. An oxide including indium is known as a transparent electroconductive film, and as described in Japanese Patent Laying-Open No. 2002-256424, an electric resistivity of a film used as the transparent electroconductive film is generally lower than $10^{-1}$ Ωcm. On the other hand, when the oxide semiconductor film is used as a channel layer of a semiconductor device as in the present invention, the electric resistivity of the oxide semiconductor film needs to be equal to or higher than $10^{-1}$ Ωcm. In order to achieve this electric resistivity, it is preferable to comprehensively consider the film thickness of the oxide semiconductor film, the W content rate, the Zn content rate, and the Zn/W ratio. In addition, in order to achieve this electric resistivity, it is desirable to perform, in the oxygen-containing atmosphere, the heating treatment after formation of the oxide semiconductor film by the sputtering method, and/or to perform the heating treatment while using an oxide for a layer (an etching stopper layer, a gate insulating film, a passivation film) that is in contact with at least a part of the oxide semiconductor film.

It is preferable that a film thickness of the oxide semiconductor film according to the present embodiment is equal to or greater than 2 nm and equal to or smaller than 25 nm. When the film thickness is equal to or greater than 2 nm and equal to or smaller than 25 nm, a high field-effect mobility can be easily achieved in a semiconductor device including this oxide semiconductor film as a channel layer. If the film thickness exceeds 25 nm, the oxide semiconductor film which is nanocrystalline oxide or amorphous oxide cannot be achieved in some cases, and in this case, the field-effect mobility decreases.

The film thickness equal to or greater than 2 nm and equal to or smaller than 25 nm is advantageous in that the oxide semiconductor film which is nanocrystalline oxide or amorphous oxide can be easily achieved and a high field-effect mobility can be achieved in a semiconductor device including this oxide semiconductor film as a channel layer. According to the oxide semiconductor film having a film thickness equal to or greater than 2 nm and equal to or smaller than 25 nm and composed of nanocrystalline oxide or amorphous oxide, a high field-effect mobility of, for example, 30 cm²/Vs or higher can be achieved in a semiconductor device including this oxide semiconductor film as a channel layer. From the perspective of achieving a higher field-effect mobility, the film thickness of the oxide semiconductor film is preferably equal to or greater than 5 nm, and preferably equal to or smaller than 18 nm.

The film thickness of the oxide semiconductor film is calculated by observing a film cross section with a transmission electron microscope, measuring a distance from a lowermost surface to an uppermost surface of the film, and dividing the distance by an observation magnification. Measurement of the distance is performed at five points and the film thickness is calculated from an average value thereof.

In the oxide semiconductor film according to the present embodiment, it is preferable that an atomic ratio of Zn to W (Zn/W ratio) in the oxide semiconductor film is equal to or higher than 0.5 and equal to or lower than 30. As described below, the oxide semiconductor film according to the present embodiment can be obtained, for example, by performing the heating treatment after film formation by the sputtering method, or by performing the heating treatment during film formation by the sputtering method. As the temperature of this heating treatment becomes higher, the field-effect mobility tends to become lower. Since the Zn/W ratio is equal to or higher than 0.5, the field-effect mobility can be maintained high even when the heating treatment temperature becomes high. Namely, since the Zn/W ratio is equal to or higher than 0.5, the decrease in field-effect mobility caused by the increase in heating treatment temperature can be suitably suppressed. If the Zn/W ratio is lower than 0.5, suppression of the decrease in field-effect mobility caused by the increase in heating treatment temperature tends to be insufficient and the degree of decrease may be equivalent to the case in which a contained amount of Zn is zero, for example. From the perspective of the field-effect mobility, the Zn/W ratio is more preferably equal to or higher than 0.6, further preferably equal to or higher than 1, particularly preferably equal to or higher than 3, and most preferably equal to or higher than 5.

On the other hand, since the Zn/W ratio is equal to or lower than 30, the OFF current can be decreased in a semiconductor device (e.g., a TFT) including the oxide semiconductor film as a channel layer. From the perspective of decreasing the OFF current, the Zn/W ratio is more preferably equal to or lower than 20. In addition, an increase in W content rate and an increase in Zn/W ratio allows the nanocrystalline oxide or the amorphous oxide to be maintained up to a greater film thickness. However, from the perspective of increasing the field-effect mobility, it is desirable that a Zn/(In+Zn) atomic ratio is lower than 0.2.

Contained amounts of In, W and Zn in the oxide semiconductor film are measured by RBS (Rutherford backscattering analysis). Based on this measurement result, the W content rate and the Zn/W ratio are calculated. When analysis by the RBS cannot be performed, the contained amounts are measured by TEM-EDX (a transmission electron microscope with an energy-dispersive X-ray fluorescence spectrometer). From the perspective of the accuracy of chemical composition measurement, measurement by the RBS is desirable. When the TEM-EDX is used, at least three or more oxide semiconductor films are first prepared as samples for making a calibration curve, and each of these oxide semiconductor films are made of In, W, Zn, and O, has a composition close to that of an oxide semiconductor film to be measured, and can be subjected to analysis by the RBS. Next, as to these samples, contained amounts of In, W and Zn are measured by the RBS and the contained amounts of In, W and Zn are measured by the TEM-EDX. Based on these measurement values, a calibration curve indicating a relationship between the measurement value of the contained amounts of In, W and Zn by the TEM-EDX and the measurement value of the contained amounts of In, W and Zn by the RBS is made. Then, as to the oxide semiconductor film to be measured, contained amounts of In, W and Zn are measured by the TEM-EDX, and thereafter, this measurement value is converted into a measurement value of the contained amounts of In, W and Zn by the RBS based on the aforementioned calibration curve. This converted value refers to the contained amounts of In, W and Zn in the oxide semiconductor film to be measured.

The oxide semiconductor film according to the present embodiment can be obtained by a manufacturing method including a step of film formation by the sputtering method. This is advantageous in achieving threshold voltage $V_{th}$ of 0 to 4 V (and further 2 to 4 V) and achieving a high field-effect mobility in a semiconductor device (e.g., a TFT) including the oxide semiconductor film as a channel layer. In addition, this is advantageous in decreasing the OFF current and achieving the aforementioned excellent threshold voltage $V_{th}$ and field-effect mobility in a semiconductor device (e.g., a TFT) including the oxide semiconductor film as a channel layer. Film formation by the sputtering method is effective in increasing the field-effect mobility, among others.

The sputtering method refers to a method for forming the film constituted by the atoms forming the target, by arranging the target and the substrate in a film formation chamber to face each other, applying a voltage to the target, and sputtering a surface of the target with a noble gas ion, thereby releasing the atoms forming the target from the target and depositing the atoms on the substrate.

In addition to the sputtering method, a pulsed laser deposition (PLD) method, a heating deposition method and the like are proposed as a method for forming the oxide semiconductor film. For the aforementioned reasons, however, the use of the sputtering method is preferable.

A magnetron sputtering method, a facing target-type magnetron sputtering method and the like can be used as the sputtering method. As the atmospheric gas during sputtering, an Ar gas, a Kr gas and a Xe gas can be used, and a mixture of these gases with an oxygen gas can also be used.

In addition, the oxide semiconductor film according to the present embodiment can also be obtained by performing the heating treatment after film formation by the sputtering method, or by performing the heating treatment during film formation by the sputtering method. As a result, the oxide semiconductor film composed of nanocrystalline oxide or amorphous oxide is easily obtained. In addition, the oxide semiconductor film obtained by this method is advantageous in achieving threshold voltage $V_{th}$ of 0 to 4 V (and further 2 to 4 V) and achieving a high field-effect mobility in a semiconductor device (e.g., a TFT) including this oxide semiconductor film as a channel layer. In addition, the oxide semiconductor film obtained by this method is advantageous in decreasing the OFF current and achieving the aforementioned excellent threshold voltage $V_{th}$ and field-effect mobility in a semiconductor device (e.g., a TFT) including the oxide semiconductor film as a channel layer. Formation of the oxide semiconductor film by the aforementioned method is effective in increasing the field-effect mobility, among others.

The heating treatment performed during film formation by the sputtering method can be performed by heating a substrate during this film formation. The substrate temperature is preferably equal to or higher than 100° C. and equal to or lower than 250° C. The heating treatment time corresponds to the film formation time and the film formation time depends on the film thickness of the oxide semiconductor film to be formed. The film formation time can be, for example, approximately 10 seconds to 10 minutes.

The heating treatment performed after film formation by the sputtering method can also be performed by heating a substrate. The substrate temperature is preferably equal to or higher than 100° C. and equal to or lower than 250° C. The atmosphere of the heating treatment may be various types of atmospheres such as in the air, in the nitrogen gas, in the nitrogen gas-oxygen gas, in the Ar gas, in the Ar-oxygen gas, in the water vapor-containing air, and in the water vapor-containing nitrogen. The pressure in the atmosphere can be a pressure under reduced pressure conditions (e.g., lower than 0.1 Pa) or a pressure under increased pressure conditions (e.g., 0.1 Pa to 9 MPa), in addition to the atmospheric pressure, and is preferably the atmospheric pressure. The heating treatment time can be, for example, approximately 3 minutes to 2 hours, and is preferably approximately 10 minutes to 90 minutes. In the semiconductor device according to the present embodiment, it is desirable to perform the heating treatment in the oxygen-containing atmosphere when an oxide layer (an etching stopper layer, a gate insulating film, a passivation film) is not in contact with at least a part of the oxide semiconductor film. The oxide semiconductor film obtained by heating in this oxygen-containing atmosphere is advantageous in obtaining an electric resistivity of $10^{-1}$ Ωcm or higher. In addition, the oxide semiconductor film obtained by heating in this oxygen-containing atmosphere is also advantageous in achieving threshold voltage $V_{th}$ of 0 to 4 V (and further 2 to 4 V) and achieving a high field-effect mobility in a semiconductor device (e.g., a TFT) including this oxide semiconductor film as a channel layer. In addition, the oxide semiconductor film obtained by heating in this oxygen-containing atmosphere is also advantageous in decreasing the OFF current and achieving the aforementioned excellent threshold voltage $V_{th}$ and field-effect mobility in a semiconductor device (e.g., a TFT) including the oxide semiconductor film as a channel layer.

[Second Embodiment: Semiconductor Device]

The semiconductor device according to the present embodiment includes the oxide semiconductor film of the first embodiment. Since the semiconductor device of the present embodiment includes the oxide semiconductor film of the first embodiment, it is possible to achieve threshold voltage $V_{th}$ of 0 to 4 V (and further 2 to 4 V) and achieve a high field-effect mobility. In addition, it is also possible to decrease the OFF current and achieve the aforementioned excellent threshold voltage $V_{th}$ and field-effect mobility in the semiconductor device of the present embodiment. Although the semiconductor device is not particularly limited, a TFT including the oxide semiconductor film of the first embodiment as a channel layer is a suitable example.

Figure 2:
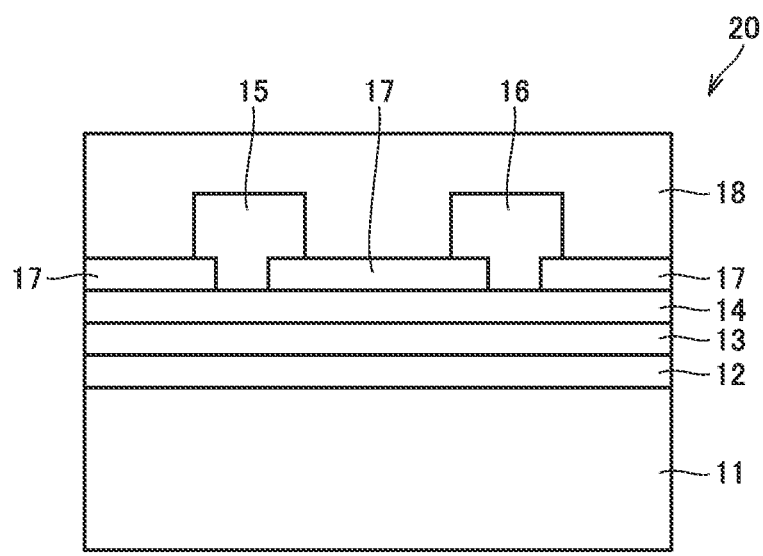
FIG. 2 is a schematic cross-sectional view showing another example of the semiconductor device according to one aspect of the present invention.
Figure 3:
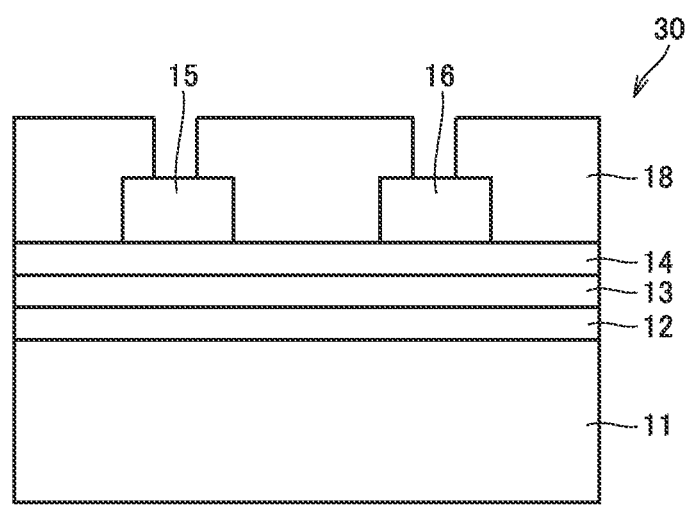
FIG. 3 is a schematic cross-sectional view showing still another example of the semiconductor device according to one aspect of the present invention.

FIGS. 1 to 3 are schematic views showing several examples of the semiconductor device (TFT) according to the present embodiment. A semiconductor device 10 shown in FIG. 1 includes a substrate 11, a gate electrode 12 arranged on substrate 11, a gate insulating film 13 arranged on gate electrode 12 as an insulating layer, an oxide semiconductor film 14 arranged on gate insulating film 13 as a channel layer, and a source electrode 15 and a drain electrode 16 arranged on oxide semiconductor film 14 so as not to be in contact with each other.

A semiconductor device 20 shown in FIG. 2 has a configuration similar to that of semiconductor device 10 shown in FIG. 1, except that semiconductor device 20 further includes an etching stopper layer 17 arranged on oxide semiconductor film 14 and having a contact hole, and a passivation film 18 arranged on etching stopper layer 17, source electrode 15 and drain electrode 16. In semiconductor device 20 shown in FIG. 2, passivation film 18 can be omitted as in semiconductor device 10 shown in FIG. 1. A semiconductor device 30 shown in FIG. 3 has a configuration similar to that of semiconductor device 10 shown in FIG. 1, except that semiconductor device 30 further includes passivation film 18 arranged on oxide semiconductor film 14, source electrode 15 and drain electrode 16.

It is preferable that the semiconductor device according to the present embodiment includes the oxide semiconductor film of the first embodiment and further includes a layer (hereinafter, this layer will be also referred to as "adjacent layer") which is arranged to be in contact with at least a part of this oxide semiconductor film and which is at least one of a nanocrystalline layer and an amorphous layer. By providing the adjacent layer, oxide semiconductor film 14 formed to be in contact with the adjacent layer is affected by the crystallinity of the adjacent layer and easily becomes a film composed of nanocrystalline oxide or amorphous oxide. With this, an excellent field-effect mobility can also be provided to the semiconductor device. According to the semiconductor device including the adjacent layer, a high field-effect mobility can be maintained even when the aforementioned heating treatment temperature is high. In the case where the film composed of amorphous oxide can be maintained even when the heating treatment temperature is higher, a high field-effect mobility can be kept.

The whole of the aforementioned adjacent layer may be at least either nanocrystalline or amorphous, or a portion of the aforementioned adjacent layer that is in contact with the oxide semiconductor film may be at least either nanocrystalline or amorphous. In the latter case, the portion that is at least either nanocrystalline or amorphous may be the whole over the film surface direction in the adjacent layer, or may be a part of the surface that is in contact with the oxide semiconductor film.

The adjacent layer that is at least one of a nanocrystalline layer and an amorphous layer may be a layer formed to be in contact with oxide semiconductor film 14 as an underlayer (lower layer) of oxide semiconductor film 14, or may be an upper layer formed to be in contact with an upper part of oxide semiconductor film 14. In addition, the semiconductor device according to the present embodiment can include two or more adjacent layers, and in this case, these adjacent layers can be a lower layer and an upper layer of oxide semiconductor film 14.

For example, in semiconductor device 10 shown in FIG. 1, gate insulating film 13 may be the aforementioned adjacent layer. In semiconductor device 20 shown in FIG. 2, gate insulating film 13 and/or etching stopper layer 17 may be the aforementioned adjacent layer. In semiconductor device 30 shown in FIG. 3, gate insulating film 13 and/or passivation film 18may be the aforementioned adjacent layer.

It is preferable that the aforementioned adjacent layer is an oxide layer including at least one of silicon and aluminum. The feature that the adjacent layer is an oxide layer including at least one of silicon and aluminum is advantageous in achieving an electric resistivity of $10^{-1}$ Ωcm or higher. In addition, this feature is also advantageous in providing an excellent field-effect mobility to the semiconductor device, and especially, this feature is advantageous in providing the semiconductor device that can maintain a high field-effect mobility even when the aforementioned heating treatment temperature is high. In addition, the feature that the adjacent layer is an oxide layer including at least one of silicon and aluminum may be advantageous in decreasing the OFF current. Although the oxide including at least one of silicon and aluminum is not particularly limited, examples of the oxide can include silicon oxide ($SiO_x$), aluminum oxide ($Al_mO_n$) and the like.

Figure 4:
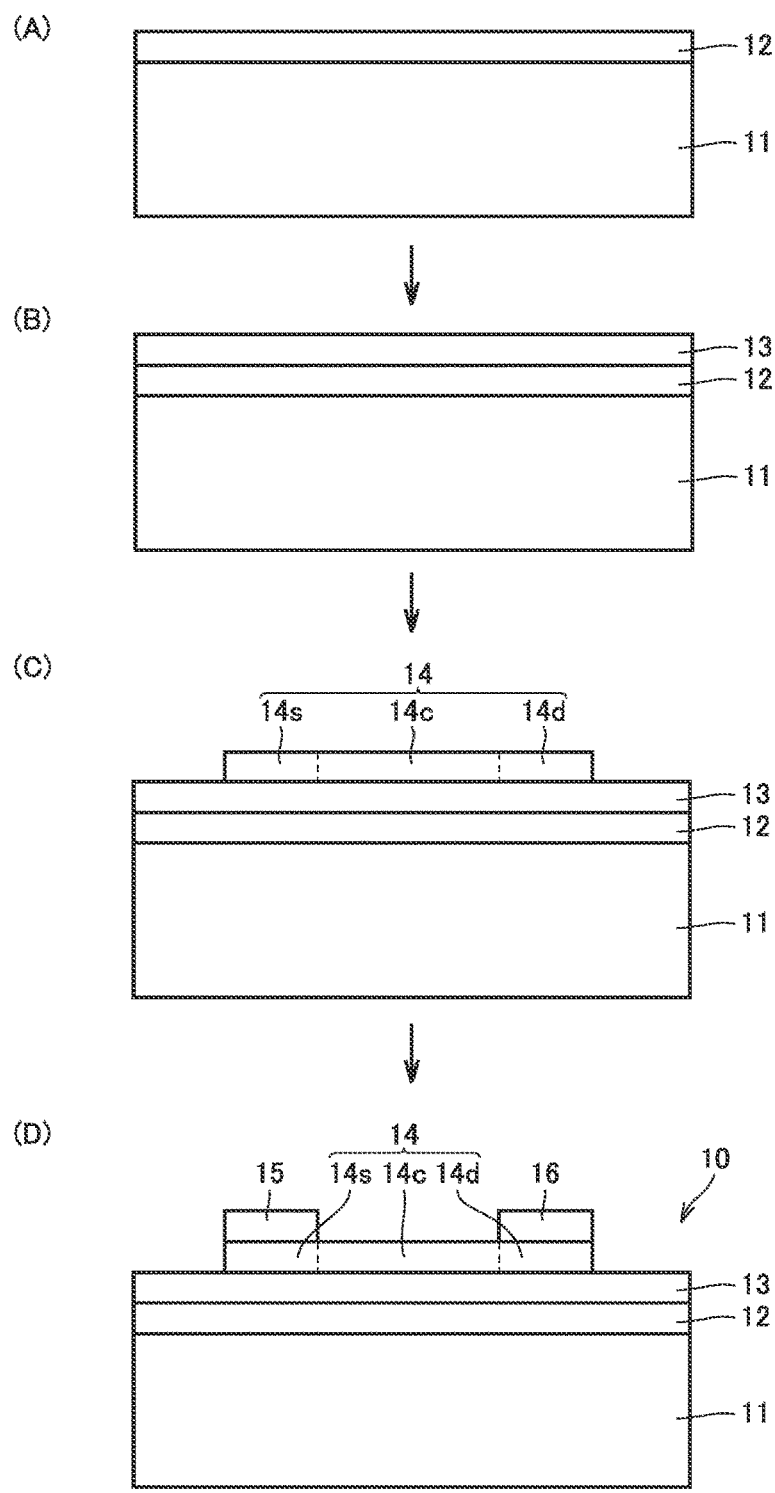
FIG. 4 is a schematic cross-sectional view showing one example of a method for manufacturing the semiconductor device shown in FIG. 1.

Next, a method for manufacturing the semiconductor device according to the present embodiment will be described. First, a method for manufacturing semiconductor device 10 shown in FIG. 1 will be described. This manufacturing method is not particularly limited. However, from the perspective of efficiently manufacturing semiconductor device 10 having high characteristics, it is preferable that, referring to FIG. 4, the method for manufacturing semiconductor device 10 shown in FIG. 1 includes the steps of forming gate electrode 12 on substrate 11 (FIG. 4(A)), forming gate insulating film 13 on gate electrode 12 as the insulating layer (FIG. 4(B)), forming oxide semiconductor film 14 on gate insulating film 13 as the channel layer (FIG. 4(C)), and forming source electrode 15 and drain electrode 16 on oxide semiconductor film 14 so as not to be in contact with each other (FIG. 4(D)).

(1) Step of Forming Gate Electrode

Referring to FIG. 4(A), gate electrode 12 is formed on substrate 11. Although substrate 11 is not particularly limited, a quartz glass substrate, an alkali-free glass substrate, an alkali glass substrate or the like is preferable from the perspective of increasing the transparency, the price stability and the surface smoothness. Although gate electrode 12 is not particularly limited, an Mo electrode, a Ti electrode, a W electrode, an Al electrode, a Cu electrode or the like is preferable from the perspective of high oxidation resistance and low electric resistance. Although a method for forming gate electrode 12 is not particularly limited, the vacuum vapor deposition method, the sputtering method or the like is preferable from the perspective of allowing large-area and uniform formation on a main surface of substrate 11.

(2) Step of Forming Gate Insulating Film

Referring to FIG. 4(B), gate insulating film 13 is formed on gate electrode 12 as the insulating layer. Although a method for forming gate insulating film 13 is not particularly limited, a plasma CVD (chemical vapor deposition) method or the like is preferable from the perspectives of allowing large-area and uniform formation and of ensuring the insulation property.

Although a material of gate insulating film 13 is not particularly limited, silicon oxide ($SiO_x$), silicon nitride ($SiN_y$) or the like is preferable from the perspective of the insulation property. When gate insulating film 13 is the aforementioned adjacent layer, an oxide including at least one of silicon and aluminum, such as silicon oxide ($SiO_x$) and aluminum oxide ($Al_mO_n$), is preferable.

(3) Step of Forming Oxide Semiconductor Film

Referring to FIG. 4(C), oxide semiconductor film 14 is formed on gate insulating film 13 as the channel layer. As described above, it is preferable that oxide semiconductor film 14 is formed by a process including the step of film formation by the sputtering method, and it is preferable, for example, that oxide semiconductor film 14 is formed by performing the heating treatment after film formation by the sputtering method, or by performing the heating treatment during film formation by the sputtering method. An In—W—Zn—O sintered body is used as a raw material target for the sputtering method. Targets described in, for example, Japanese Patent Application No. 2014-164142 and Japanese Patent Application No. 2014-061493 can be used as a sintered body target.

(4) Step of Forming Source Electrode and Drain Electrode

Referring to FIG. 4(D), source electrode 15 and drain electrode 16 are formed on oxide semiconductor film 14 so as not to be in contact with each other. Although source electrode 15 and drain electrode 16 are not particularly limited, an Mo electrode, a Ti electrode, a W electrode, an Al electrode, a Cu electrode or the like is preferable from the perspective of high oxidation resistance, low electric resistance and low contact electric resistance with oxide semiconductor film 14. Although a method for forming source electrode 15 and drain electrode 16 is not particularly limited, the vacuum vapor deposition method, the sputtering method or the like is preferable from the perspective of allowing large-area and uniform formation on the main surface of substrate 11 having oxide semiconductor film 14 formed thereon. Although a method for forming source electrode 15 and drain electrode 16 so as not to be in contact with each other is not particularly limited, formation by an etching method using a photoresist is preferable from the perspective of allowing large-area and uniform formation of the patterns of source electrode 15 and drain electrode 16.

Next, a method for manufacturing semiconductor device 20 shown in FIG. 2 will be described. This manufacturing method can be similar to the method for manufacturing semiconductor device 10 shown in FIG. 1, except that this manufacturing method further includes the steps of forming etching stopper layer 17 having a contact hole 17a, and forming passivation film 18. Specifically, it is preferable that, referring to FIGS. 4 and 5, the method for manufacturing semiconductor device 20 shown in FIG. 2 includes the steps of forming gate electrode 12 on substrate 11 (FIG. 4(A)), forming gate insulating film 13 on gate electrode 12 as the insulating layer (FIG. 4(B)), forming oxide semiconductor film 14 on gate insulating film 13 as the channel layer (FIG. 4(C)), forming etching stopper layer 17 on oxide semiconductor film 14 (FIG. 5(A)), forming contact hole 17a in etching stopper layer 17 (FIG. 5(B)), forming source electrode 15 and drain electrode 16 on oxide semiconductor film 14 and etching stopper layer 17 so as not to be in contact with each other (FIG. 5(C)), and forming passivation film 18 on etching stopper layer 17, source electrode 15 and drain electrode 16 (FIG. 5(D)).

Although a material of etching stopper layer 17 is not particularly limited, silicon oxide ($SiO_x$), silicon nitride ($SiN_y$), aluminum oxide ($Al_mO_n$) or the like is preferable from the perspective of the insulation property. When etching stopper layer 17 is the aforementioned adjacent layer, an oxide including at least one of silicon and aluminum, such as silicon oxide ($SiO_x$) and aluminum oxide ($Al_mO_n$), is preferable. Etching stopper layer 17 may be a combination of films made of different materials. Although a method for forming etching stopper layer 17 is not particularly limited, the plasma CVD (chemical vapor deposition) method, the sputtering method, the vacuum vapor deposition method or the like is preferable from the perspectives of allowing large-area and uniform formation and of ensuring the insulation property.

Since source electrode 15 and drain electrode 16 need to be in contact with oxide semiconductor film 14, etching stopper layer 17 is formed on oxide semiconductor film 14, and thereafter, contact hole 17a is formed in etching stopper layer 17 (FIG. 5(B)). An example of a method for forming contact hole 17a can include dry etching or wet etching. By etching etching stopper layer 17 and forming contact hole 17a by this method, a surface of oxide semiconductor film 14 is exposed in the etched portion.

Similarly to the method for manufacturing semiconductor device 10 shown in FIG. 1, in the method for manufacturing semiconductor device 20 shown in FIG. 2, source electrode 15 and drain electrode 16 are formed on oxide semiconductor film 14 and etching stopper layer 17 so as not to be in contact with each other (FIG. 5(C)), and thereafter, passivation film 18 is formed on etching stopper layer 17, source electrode 15 and drain electrode 16 (FIG. 5(D)).

Although a material of passivation film 18 is not particularly limited, silicon oxide ($SiO_x$), silicon nitride ($SiN_y$), aluminum oxide ($Al_mO_n$) or the like is preferable from the perspective of the insulation property. When passivation film 18 is the aforementioned adjacent layer, an oxide including at least one of silicon and aluminum, such as silicon oxide (SiO$_x$) and aluminum oxide (Al$_m$O$_n$), is preferable. Passivation film 18 may be a combination of films made of different materials. Although a method for forming passivation film 18 is not particularly limited, the plasma CVD (chemical vapor deposition) method, the sputtering method, the vacuum vapor deposition method or the like is preferable from the perspectives of allowing large-area and uniform formation and of ensuring the insulation property.

Like semiconductor device 30 shown in FIG. 3, a back channel etching (BCE) structure may be employed without forming etching stopper layer 17, and passivation film 18 may be directly formed on oxide semiconductor film 14, source electrode 15 and drain electrode 16. As to passivation film 18 in this case, the above description about passivation film 18 of semiconductor device 20 shown in FIG. 2 is cited.

EXAMPLE

Examples 1 to 16, Comparative Examples 1 to 2

(1) Fabrication of Semiconductor Device (TFT) Including Oxide Semiconductor Film A TFT having a configuration similar to that of semiconductor device 30 shown in FIG. 3 was fabricated in accordance with the following procedure. Referring to FIG. 4(A), a synthetic quartz glass substrate of 50 mm×50 mm×0.6 mm in thickness was first prepared as substrate 11, and an Mo electrode having a thickness of 100 nm was formed on substrate 11 as gate electrode 12 by the sputtering method.

Referring to FIG. 4(B), an SiO$_x$ film or an SiN$_y$ film of 200 nm in thickness, which was an amorphous oxide layer, was next formed on gate electrode 12 as gate insulating film 13 by the plasma CVD method. In the section of "GI Layer" in Table 1 below, the material of gate insulating film 13 used in each of Examples and Comparative Examples is described.

Referring to FIG. 4(C), oxide semiconductor film 14 having a thickness of 10 nm was next formed on gate insulating film 13 by a DC (direct current) magnetron sputtering method. A plane of the target having a diameter of 3 inches (76.2 mm) was a sputtering surface. The used target was an In—W—Zn—O sintered body, and the contained amount of W and the contained amount of Zn in the sintered body were adjusted such that the W content rate and the Zn/W ratio in oxide semiconductor film 14 had values shown in Table 1.

Formation of oxide semiconductor film 14 will be described more specifically. Substrate 11 having aforementioned gate electrode 12 and gate insulating film 13 formed thereon was arranged on a water-cooled substrate holder in a film formation chamber of a sputtering apparatus (not shown) such that gate insulating film 13 was exposed. The aforementioned target was arranged at a distance of 90 mm to face gate insulating film 13. The degree of vacuum in the film formation chamber was set at approximately 6×10$^{-5}$ Pa and the target was sputtered as follows.

First, with a shutter interposed between gate insulating film 13 and the target, a mixed gas of an Ar (argon) gas and an O$_2$ (oxygen) gas was introduced into the film formation chamber until the pressure of 0.5 Pa was reached. A content rate of the O$_2$ gas in the mixed gas was 20 volume %. The DC electric power of 110 W was applied to the target to cause sputtering discharge, and thereby, cleaning (pre-sputtering) of the target surface was performed for 5 minutes.

Next, the DC electric power of 110 W was applied to the same target, and with the atmosphere in the film formation chamber maintained, the aforementioned shutter was removed and oxide semiconductor film 14 was formed on gate insulating film 13. A bias voltage was not particularly applied to the substrate holder. The substrate holder was water-cooled or heated and the temperature of substrate 11 during film formation and after film formation was adjusted. Of Examples and Comparative Examples, in Examples in which "during film formation" is described in the section of "Heating Treatment" in Table 1 below, the substrate holder was heated and the substrate temperature was adjusted to the temperature described in the section of "Treatment Temperature" in Table 1 during film formation, and thereby, the heating treatment was performed simultaneously with film formation. In this case, the heating treatment time corresponds to the film formation time. On the other hand, of Examples and Comparative Examples, in the case where "after film formation" is described in the section of "Heating Treatment" in Table 1 below, the substrate holder was water-cooled and the substrate temperature was adjusted to approximately 20° C. during film formation, and after film formation (specifically after formation of source electrode 15 and drain electrode 16, as described below), the substrate holder was heated and the substrate temperature was adjusted to the temperature described in the section of "Treatment Temperature" in Table 1, and thereby, the heating treatment was performed. In this case, the film formation time was about 14 seconds when the film thickness of oxide semiconductor film 14 was, for example, 5 nm (Example 16), and was about 70 seconds when the film thickness of oxide semiconductor film 14 was 25 nm (Example 1). In any of Examples and Comparative Examples, the film formation time was adjusted such that the thickness of oxide semiconductor film 14 had values shown in Table 1.

As described above, oxide semiconductor film 14 was formed by the DC (direct current) magnetron sputtering method by using the target processed from the oxide sintered body. Oxide semiconductor film 14 functions as a channel layer in a TFT. The film thickness of oxide semiconductor film 14 formed in each of Examples and Comparative Examples is shown in Table 1. The film thickness of the oxide semiconductor film was calculated by observing a film cross section with the transmission electron microscope, measuring a distance from a lowermost surface to an uppermost surface of the film, and dividing the distance by an observation magnification. Measurement of the distance was performed at five points and the film thickness was calculated from an average value thereof.

Next, a part of oxide semiconductor film 14 thus formed was etched to form a source electrode forming portion 14s, a drain electrode forming portion 14d and a channel portion 14c. A size of a main surface of each of source electrode forming portion 14s and drain electrode forming portion 14d was set to be 50 μm×50 μm, and a channel length C$_L$ (referring to FIGS. 1(A) and 1(B), channel length C$_L$ refers to a distance of channel portion 14c between source electrode 15 and drain electrode 16) was set to be 30 μm, and a channel width C$_W$ (referring to FIGS. 1(A) and 1(B), channel width C$_W$ refers to a width of channel portion 14c) was set to be 40 μm. 25 channel portions 14c in length and 25 channel portions 14c in width were arranged at intervals of 3 mm within the substrate main surface of 75 mm×75 mm such that 25 TFTs in length and 25 TFTs in width were arranged at intervals of 3 mm within the substrate main surface of 75 mm×75 mm.

Etching of a part of oxide semiconductor film 14 was performed by preparing an etching aqueous solution including oxalic acid and water at a volume ratio of oxalic acid:water=5:95, and immersing substrate 11 having gate electrode 12, gate insulating film 13 and oxide semiconductor film 14 formed thereon in this order, in this etching aqueous solution at 40° C.

Referring to FIG. 4(D), source electrode 15 and drain electrode 16 were next formed on oxide semiconductor film 14 to be separated from each other.

Specifically, a resist (not shown) was first applied onto oxide semiconductor film 14 and was exposed and developed such that only the main surfaces of source electrode forming portion 14s and drain electrode forming portion 14d of oxide semiconductor film 14 were exposed. Next, an Mo electrode having a thickness of 100 nm as source electrode 15 and an Mo electrode having a thickness of 100 nm as drain electrode 16 were formed on the main surfaces of source electrode forming portion 14s and drain electrode forming portion 14d of oxide semiconductor film 14, respectively, by the sputtering method. Thereafter, the resist on oxide semiconductor film 14 was peeled off. As for the Mo electrode as source electrode 15 and the Mo electrode as drain electrode 16, one source electrode 15 and one drain electrode 16 were arranged for one channel portion 14c such that 25 TFTs in length and 25 TFTs in width were arranged at intervals of 3 mm within the substrate main surface of 75 mm×75 mm.

Of Examples and Comparative Examples, in the case where "after film formation" is described in the section of "Heating Treatment" in Table 1 below, the substrate holder was heated and the substrate temperature was adjusted to the temperature described in the section of "Treatment Temperature" in Table 1 after formation of source electrode 15 and drain electrode 16, and thereby, the heating treatment was performed in the air atmosphere. The heating treatment time was about 14 minutes.

Referring to FIG. 3, passivation film 18 was next formed on oxide semiconductor film 14, source electrode 15 and drain electrode 16. Passivation film 18 had a configuration obtained by forming an $SiO_x$ film of 100 nm in thickness, which was an amorphous oxide layer, by the plasma CVD method, and thereafter, forming an $SiN_y$ film of 200 nm in thickness on the $SiO_x$ film by the plasma CVD method, or a configuration obtained by forming an $Al_mO_n$ film of 100 nm in thickness, which was an amorphous oxide layer, by the sputtering method, and thereafter, forming an $SiN_y$ film of 200 nm in thickness on the $Al_mO_n$ film by the plasma CVD method. When the amorphous oxide layer is the $SiO_x$ film, "$SiO_x$" is described in the section of "PV Layer" in Table 1 below. When the amorphous oxide layer is the $Al_mO_n$ film, "$Al_mO_n$" is described in the section of "PV Layer".

Next, passivation film 18 on source electrode 15 and drain electrode 16 was etched by reactive ion etching and the contact hole was formed, and thereby, a part of the surface of source electrode 15 and drain electrode 16 was exposed.

Finally, annealing treatment (thermal treatment) was performed at 250° C. for 30 minutes in the nitrogen atmosphere. This annealing treatment was performed in all Examples and Comparative Examples. However, in Examples, the annealing treatment at 250° C. for 30 minutes in the nitrogen atmosphere was followed by annealing treatment at 300° C. for 30 minutes in the nitrogen atmosphere. As described above, a TFT including oxide semiconductor film 14 as a channel layer was obtained.

(2) Crystallinity, W Content Rate and Zn/W Ratio of Oxide Semiconductor Film

The crystallinity of oxide semiconductor film 14 of the fabricated TFT was evaluated in accordance with the aforementioned measurement method and definition. In the section of "Crystallinity" in Table 1, "nanocrystalline" is described when oxide semiconductor film 14 is nanocrystalline, and "amorphous" is described when oxide semiconductor film 14 is amorphous. In addition, the contained amounts of In, W and Zn in oxide semiconductor film 14 were measured by the RBS (Rutherford backscattering analysis). Based on these contained amounts, the W content rate (atomic %) and the Zn/W ratio (ratio of atomic number) in oxide semiconductor film 14 were calculated. The result is shown in Table 1.

(3) Measurement of Electric Resistivity of Oxide Semiconductor Film

A measurement needle was brought into contact with source electrode 15 and drain electrode 16. Next, a source-drain current $I_{ds}$ was measured while changing a voltage from 1 V to 20 V and applying the voltage to between source electrode 15 and drain electrode 16. A slope when drawing a $I_{ds}$-$V_{gs}$ graph refers to a resistance R. From this resistance R as well as channel length $C_L$ (30 μm), channel width $C_w$ (40 μm) and film thickness t, the electric resistivity can be determined as $R \times C_w \times t/C_L$. It was confirmed that the oxide semiconductor films of Examples all had an electric resistivity of $10^{-1}$ Ωcm or higher. On the other hand, it was confirmed that the oxide semiconductor films of Comparative Examples all had an electric resistivity lower than $10^{-1}$ Ωcm.

(4) Evaluation of Characteristics of Semiconductor Device

The characteristics of the TFT which is semiconductor device 10 were evaluated as follows. First, a measurement needle was brought into contact with gate electrode 12, source electrode 15 and drain electrode 16. A source-drain voltage $V_{ds}$ of 0.3 V was applied to between source electrode 15 and drain electrode 16, and a source-gate voltage $V_{gs}$ applied to between source electrode 15 and gate electrode 12 was changed from −10 V to 15 V and source-drain current $I_{ds}$ at this time was measured. Then, a relationship between source-gate voltage $V_{gs}$ and a square root $[(I_{ds})^{1/2}]$ of source-drain current $I_{ds}$ was graphed (hereinafter, this graph will be also referred to as "$V_{gs}$-$(I_{ds})^{1/2}$ curve"). A tangent line was drawn on the $V_{gs}$-$(I_{ds})^{1/2}$ curve, and defined as threshold voltage $V_{th}$ was an intersection point (x intercept) where the tangent line tangent to a point having the maximum slope of the tangent line intersects with the x axis ($V_{gs}$). In addition, source-drain current $I_{ds}$ when source-gate voltage $V_{gs}$ was −5 V was defined as the OFF current. Threshold voltage $V_{th}$ and the OFF current were measured for the TFT subjected to the annealing treatment at 250° C. for 30 minutes in the nitrogen atmosphere (before the annealing treatment at 300° C. for 30 minutes in the nitrogen atmosphere).

In addition, $g_m$ was derived by differentiating source-drain current $I_{ds}$ with respect to source-gate voltage $V_{gs}$ in accordance with the following equation [a]:

$$g_m = dI_{ds}/dV_{gs} \qquad [a].$$

Then, by using a value of $g_m$ when $V_{gs}$=8.0 V, a field-effect mobility $\mu_{fe}$ was calculated based on the following equation [b]:

$$\mu_{fe} = g_m \times C_L / (C_W \times C_i \times V_{ds}) \qquad [b].$$

In the aforementioned equation [b], channel length $C_L$ was 30 μm and channel width $C_W$ was 40 μm. In addition, capacitance $C_i$ of gate insulating film 13 was $3.4 \times 10^{-8}$ F/cm$^2$, and source-drain voltage $V_{ds}$ was 0.3 V.

Field-effect mobility $\mu_{fe}$ after the annealing treatment at 250° C. for 30 minutes in the nitrogen atmosphere is described in the section of "Mobility (250° C.)" in Table 1. Field-effect mobility $\mu_{fe}$ after the annealing treatment at 300°

C. for 30 minutes in the nitrogen atmosphere, which was measured for Examples, is described in the section of "Mobility (300° C.)" in Table 1. As shown in Table 1, it is seen that as the Zn/W ratio becomes higher, a difference between the mobility (250° C.) and the mobility (300° C.) becomes smaller.

TABLE 1

| | Oxide Semiconductor Film | | | Formation of Oxide Semiconductor Film | | | | Evaluation of Characteristics | | | |
|---|---|---|---|---|---|---|---|---|---|---|---|
| | Crystallinity | W Content Rate (atomic %) | Zn/W Ratio (ratio of atomic number) | Film Thickness (nm) | Heating Treatment | Treatment Temperature (° C.) | GI Layer | PV Layer | $V_{th}$ (V) | OFF Current (A) | Mobility (250° C.) (cm²/Vs) | Mobility (300° C.) (cm²/Vs) |
| Example 1 | nanocrystalline | 0.6 | 1.0 | 25 | after film formation | 100 | SiOx | AlmOn | 1.4 | $10^{-11}$ | 47 | 21 |
| Example 2 | amorphous | 0.8 | 1.0 | 18 | during film formation | 100 | SiNy | SiOx | 1.8 | $10^{-12}$ | 42 | 19 |
| Example 3 | amorphous | 1.1 | 0.4 | 10 | after film formation | 150 | SiOx | AlmOn | 2.0 | $10^{-13}$ | 40 | 20 |
| Example 4 | amorphous | 1.1 | 0.5 | 10 | after film formation | 150 | SiOx | AlmOn | 2.0 | $10^{-13}$ | 40 | 28 |
| Example 5 | amorphous | 1.1 | 1.0 | 10 | after film formation | 150 | SiOx | AlmOn | 2.0 | $10^{-13}$ | 38 | 30 |
| Example 6 | amorphous | 1.1 | 3.0 | 10 | after film formation | 150 | SiOx | AlmOn | 2.2 | $10^{-13}$ | 38 | 31 |
| Example 7 | amorphous | 1.1 | 8.0 | 10 | after film formation | 150 | SiOx | AlmOn | 2.4 | $10^{-13}$ | 38 | 33 |
| Example 8 | amorphous | 1.1 | 10.0 | 10 | after film formation | 150 | SiOx | AlmOn | 2.5 | $10^{-13}$ | 36 | 35 |
| Example 9 | amorphous | 1.5 | 1.0 | 11 | after film formation | 150 | SiOx | SiOx | 2.5 | $10^{-13}$ | 35 | 30 |
| Example 10 | amorphous | 1.5 | 15.0 | 11 | after film formation | 150 | SiOx | SiOx | 2.6 | $10^{-12}$ | 33 | 31 |
| Example 11 | amorphous | 1.5 | 20.0 | 11 | after film formation | 150 | SiOx | SiOx | 2.7 | $10^{-12}$ | 33 | 33 |
| Example 12 | amorphous | 1.5 | 23.0 | 11 | after film formation | 150 | SiOx | SiOx | 3.0 | $10^{-11}$ | 33 | 33 |
| Example 13 | amorphous | 2.0 | 1.0 | 13 | after film formation | 150 | SiOx | AlmOn | 3.2 | $10^{-13}$ | 33 | 30 |
| Example 14 | amorphous | 3.0 | 1.0 | 10 | after film formation | 150 | SiOx | AlmOn | 3.5 | $10^{-13}$ | 33 | 30 |
| Example 15 | amorphous | 4.0 | 1.0 | 8 | during film formation | 200 | SiNy | SiOx | 3.7 | $10^{-13}$ | 31 | 15 |
| Example 16 | amorphous | 5.0 | 1.0 | 5 | after film formation | 250 | SiOx | AlmOn | 4.0 | $10^{-13}$ | 30 | 25 |
| Comparative Example 1 | nanocrystalline | 0.4 | 1.0 | 10 | after film formation | 150 | SiOx | AlmOn | -1.2 | $10^{-10}$ | 6 | — |
| Comparative Example 2 | amorphous | 6.0 | 10.0 | 10 | after film formation | 150 | SiOx | AlmOn | 6.0 | $10^{-13}$ | 1 | — |

It should be understood that the embodiments disclosed herein are illustrative and non-restrictive in every respect. The scope of the present invention is defined by the terms of the claims, rather than the embodiments above, and is intended to include any modifications within the meaning and scope equivalent to the terms of the claims.

REFERENCE SIGNS LIST

10, 20, 30 semiconductor device (TFT), 11 substrate, 12 gate electrode, 13 gate insulating film, 14 oxide semiconductor film, 14c channel portion, 14d drain electrode forming portion, 14s source electrode forming portion, 15 source electrode, 16 drain electrode, 17 etching stopper layer, 17a contact hole, 18 passivation film.

The invention claimed is:

1. An oxide semiconductor film composed of nanocrystalline oxide or amorphous oxide, wherein
   the oxide semiconductor film includes indium, tungsten and zinc,
   a content rate of tungsten to a total of indium, tungsten and zinc in the oxide semiconductor film is higher than 0.5 atomic % and equal to or lower than 5 atomic %, and
   an electric resistivity of the oxide semiconductor film is equal to or higher than $10^{-1}$ Ωcm; wherein
   an atomic ratio of zinc to tungsten (Zn/W ratio) in the oxide semiconductor film is equal to or higher than 3 and equal to or lower than 30.

2. The oxide semiconductor film according to claim 1, wherein
   a film thickness of the oxide semiconductor film is equal to or greater than 2 nm and equal to or smaller than 25 nm.

3. The oxide semiconductor film according to claim 1, wherein
   an atomic ratio of zinc to tungsten (Zn/W ratio) in the oxide semiconductor film is equal to or higher than 0.5 and equal to or lower than 30.

4. The oxide semiconductor film according to claim 1, wherein
   the oxide semiconductor film is obtained by a manufacturing method including a step of film formation by a sputtering method.

5. The oxide semiconductor film according to claim 4, wherein the oxide semiconductor film is obtained by performing heating treatment after film formation by the sputtering method, or by performing heating treatment during film formation by the sputtering method.

6. A thin film transistor device comprising the oxide semiconductor film as recited in claim 1.

7. The thin film transistor device according to claim 6, further comprising a layer arranged to be in contact with at least a part of the oxide semiconductor film, wherein
the layer is at least one of a nanocrystalline layer and an amorphous layer.

8. The thin film transistor device according to claim 7, wherein
the layer is an oxide layer including at least one of silicon and aluminum.

* * * * *